United States Patent

Ishihama et al.

[15] 3,689,804

[45] Sept. 5, 1972

[54] HYBRID CIRCUIT DEVICE

[72] Inventors: Masaru Ishihama; Yukio Kobayashi, both of Tokyo, Japan

[73] Assignee: Nippondenso Co., Ltd., Kariya-shi, Aichi-ken, Japan

[22] Filed: Sept. 30, 1971

[21] Appl. No.: 185,242

[52] U.S. Cl. ...........317/100, 317/234 A, 317/234 E, 174/52 PE

[51] Int. Cl. ..............................................H05k 5/06

[58] Field of Search ..................317/100, 234, 234 E; 174/52 PE

[56] References Cited

UNITED STATES PATENTS 3,340,438 9/1967 Dion .......................317/234 E 3,259,814 7/1966 Green ....................317/234 E 3,482,198 12/1969 Hopper......................317/100

*Primary Examiner*—Lewis H. Myers

*Assistant Examiner*—Gerald P. Tolin

*Attorney*—Cushman, Darby & Cushman

[57] ABSTRACT

A hybrid circuit device including circuit elements connected on a printed circuit plate mounted on a radiator is provided with flexible insulating material packed between the elements thereof. Lead terminals are secured to the printed circuit plate and the printed circuit plate is fixed to the radiator with the intervention of flexible insulating material with a rubber-like insulator mounted on the marginal portion of the circuit plate by use of a metal frame. Flexible insulating material is covered on the circuit and the circuit is enclosed by enclosure resin.

7 Claims, 6 Drawing Figures

INVENTORS
Masaru ISHIHAMA
Yukio KOBAYASHI
BY Cushman, Darby & Cushman
ATTORNEYS

HYBRID CIRCUIT DEVICE

BACKGROUND OF THE INVENTION

This invention relates to a hybrid circuit composed of circuit elements electrically connected on a printed circuit plate, and more particularly to an improvement of a hybrid circuit device in which the construction of the enclosure is improved.

As well known in the art, the conventional hybrid circuit device is as shown in FIGS. 1 and 2, in which FIG. 1 is a perspective view of the conventional hybrid circuit device, and FIG. 2 is an elevational sectional view of the same. In FIGS. 1 and 2, circuit elements such as thin and thick circuits 3, active elements 4 and the like are electrically connected with each other on a printed circuit plate 2 to form a hybrid circuit. Lead terminals 5 are fixed to the printed circuit plate 2, which is mounted on a radiating plate 1. The periphery of the printed circuit plate 2 is enclosed by enclosure resin 6 as of epoxide resin.

However, in the conventional hybrid circuit device as described above, in the event that the ambient temperature of the device abruptly varies, it sometimes happens that the printed circuit plate 2 cracks due to the difference of thermal expansivity between the enclosure resin 6, the printed circuit plate 2 and the radiating plate 1, and that the circuit elements such as the thin and thick circuits 3 and active elements 4 are broken due to the distortion caused by thermal expansion of the enclosure resin 6.

SUMMARY OF THE INVENTION

The primary object of the present invention is to provide an improved hybrid circuit construction in which the printed circuit plate will not crack even if the ambient temperature abruptly varies.

Another object of the present invention is to provide a hybrid circuit construction in which the circuit elements assembled therein will not be broken even if the ambient temperature is abruptly varied.

A further object of the present invention is to provide a hybrid circuit device in which a flexible insulating material is used for covering the printed circuit plate to protect the printed circuit plate from external force caused by temperature variation.

A still further object of the present invention is to provide a hybrid circuit device in which a rubber-like insulating material is used for enclosing the periphery of the printed circuit plate to protect the printed circuit plate and the circuit elements provided thereon from external stress caused by temperature variation.

Above objects of the present invention are accomplished by providing a hybrid circuit device as defined below, that is, the hybrid circuit device in accordance with the present invention comprises a radiating plate, a printed circuit plate mounted thereon, a plurality of circuit elements electrically connected on the printed circuit plate to form a hybrid circuit, lead terminals secured to the printed circuit plate for serving as electric terminals of the hybrid circuit, rubber-like insulating material enclosing the periphery of the printed circuit plate, a metal frame having an opening at a portion thereof opposed to the printed circuit plate, said metal frame being fixed to the edge portion of the radiating plate, said rubber-like insulating material being pressed toward the printed circuit plate by the metal frame, flexible insulating material covered on the printed circuit plate, and enclosure resin enclosing at least the flexible insulating material.

In accordance with the present invention as defined above, the printed circuit plate is prevented from cracking and the circuit elements are prevented from being broken when the ambient temperature of the hybrid circuit device is abruptly varied by absorbing the strain caused by the difference in the thermal expansivity of the elements incorporated in the hybrid device and by the thermal expansion of the enclosing resin by use of flexible insulating material and rubber-like insulating material.

DESCRIPTION OF THE PREFERRED EMBODIMENTS

Figure 1:
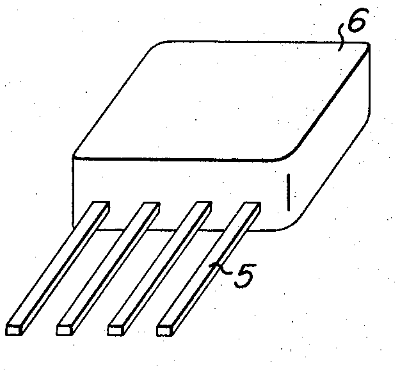
FIG. 1 PRIOR ART
FIG. 1 is a perspective view of an example of the conventional hybrid circuit device.
Figure 2:
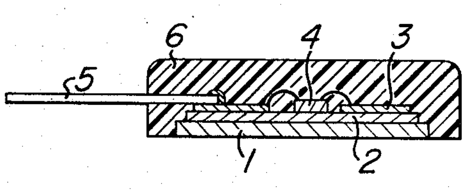
FIG. 2 PRIOR ART
FIG. 2 is a partial sectional view of the conventional hybrid circuit device shown in FIG. 1.
Figures 3, 4, 5, 6:
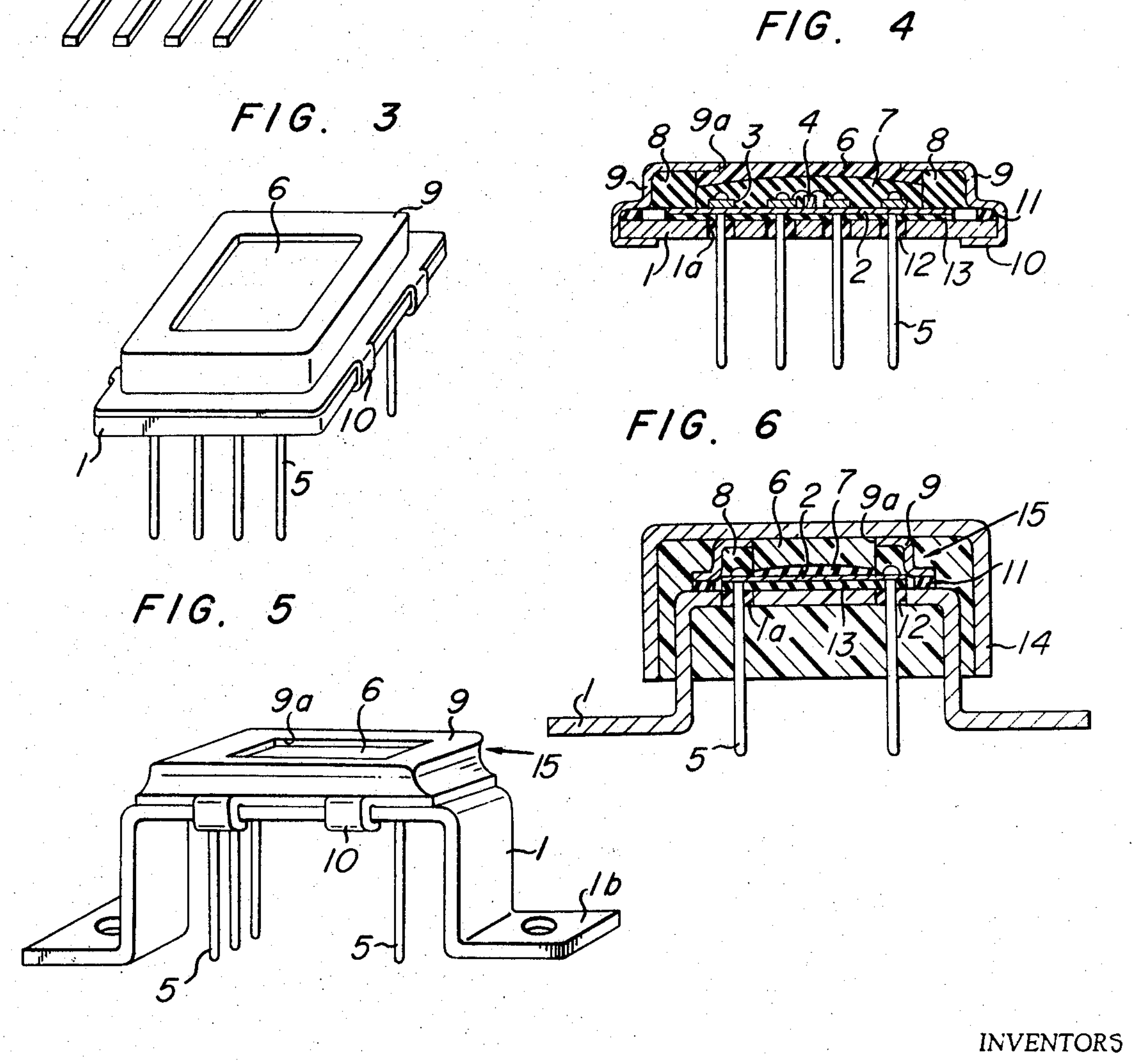
FIG. 3 is a perspective view showing a first embodiment of the hybrid circuit device in accordance with the present invention.
FIG. 4 is a partial sectional view of the embodiment of the invention shown in FIG. 3.
FIG. 5 is a perspective view showing a second embodiment of the hybrid circuit device in accordance with the present invention.
FIG. 6 is a partial sectional view showing the hybrid circuit device of FIG. 5 sealed in resin seal, wherein the same or equivalent elements are designated by the same reference numeral.

Referring to FIGS. 3 and 4 in which the elements equivalent to those shown in FIGS. 1 and 2 are indicated by the same reference numeral, a layer of flexible insulating material 13 is interposed between the radiating plate 1 and the printed circuit plate 2. The lead terminals 5 are guided out of the holes 1a provided in the radiating plate 1 which is filled with flexible insulating material 12. The reference numeral 8 indicates rubber-like indulating material having elasticity which encloses the marginal portion of the printed circuit plate 2. The reference numeral 9 indicates a metal frame provided with an opening 9*a* at a position opposed to the printed circuit plate 2 and provided with a hook portion 10 at the marginal portion thereof. The metal frame 9 holds the rubber-like insulating material 8 by pressing it on the printed circuit plate 2 and by holding the end of the radiating plate 1 with the hook portion 10 thereof. Between the metal frame 9 and the radiating plate 1 is inserted flexible material 11. The reference numeral 7 indicates flexible insulating material covered on the printed circuit plate 2 and circuit elements such as thin and thick circuits 3 and active elements 4 connected with each other on the printed circuit plate 2 forming a hybrid circuit. The flexible insulating material 7 is enclosed with enclosure resin 6.

Now the process for making the hybrid circuit device in accordance with the first embodiment of the present invention will be described in detail. First, circuit elements such as thin and thick circuits 3 and active elements 4 are electrically connected with each other on the printed circuit plate 2 to form a hybrid circuit, and lead terminals 5 are secured to the printed circuit plate 2 to make electric terminals of the hybrid circuit. The printed circuit plate 2 is mounted on the radiating plate 1 with the intervention of flexible insulating material layer 13 with the lead terminals 5 extended out of the holes 1*a* provided in the radiating plate 1. The holes 1a are filled with flexible insulating material 12 and the material is hardened. The marginal portion of the printed circuit plate 2 is enclosed by elastic rubber-like insulating material 8 and the marginal portion of the radiating plate 1 is provided with flexible material 11. A metal frame 9 is fixed to the radiating plate 1 pressing the rubber-like insulating material 8 onto the printed circuit plate 2 by means of the hooked marginal portion 10 thereof. Then, flexible insulating material 7 is poured into the space on the circuit surrounded by the rubber-like insulating material 8 through the opening 9*a* of the metal frame 9 and hardened to cover the printed circuit plate 2 with the circuit elements such as the thin and thick circuits 3 and active elements 4 connected thereon to form a hybrid circuit. Thereafter, enclosure resin 6 is poured thereon and hardened to enclose the flexible insulating material 7 therewith.

By making the hybrid circuit device as described above, the strain caused by the difference of thermal expansivity between the enclosure resin 6 and the printed circuit plate 2 and the radiating plate 1 and by the thermal expansion of the enclosure resin 6 is absorbed by the elasticity of the flexible insulating material 7 and 13 and the rubber-like insulating material 8 even when the ambient temperature of the hybrid circuit device is abruptly varied. Therefore, the cracking of the printed circuit plate 2 and braking of the circuit elements such as thin and thick circuits 3 and active elements 4 forming a hybrid circuit on the printed circuit plate 2 are prevented.

Although in the embodiment as described above, the lead terminals 5 have been extended out of holes 1*a* provided in the radiating plate 1, it will be understood that the terminals 5 may be guided out through the flexible insulating material 7 and enclosure resin 6.

Now the second embodiment o the present invention will be described referring to FIGS. 5 and 6, in which the equivalent elements are indicated by the same reference numeral as that in FIGS. 1 through 4. The opposite ends of the radiating plate 1 are extended lengthwise and bend twice in the opposite directions to form fixing portions 1b at the ends thereof. The reference numeral 14 indicates an enclosure resin casing in which the foregoing radiating plate 1, the printed circuit plate, 2, the hybrid circuits 3 and 4, a portion of the lead pins 5, flexible insulating materials 7, 12 and 13, the rubber-like insulating material 8, the metal frame 9 and the flexible material 11 (hereinafter referred to simply as "body of the device 15") are retained. The enclosure resin casing 14 is further filled with enclosure resin 6 enclosing the body of the device 15.

The process for making the second embodiment of the hybrid circuit device of the present invention will now be described. The body of the device 15 is prepared by the same process as that for making the first embodiment. Then, the body of the device 15 is inserted into an enclosure resin casing 14 and the enclosure resin 6 is poured into the resin casing 14 and hardened. By making the hybrid circuit device as described above, the strain caused by the difference in thermal expansivity between the enclosure resin 6 and the printed circuit plate 2 and the radiating plate 1 and by the thermal expansion of the enclosure resin 6 is absorbed by elasticity of the flexible insulating material 8 even when the ambient temperature of the hybrid circuit device is abruptly varied. Therefore, the cracking of the printed circuit plate 2 and the braking of the circuit elements forming a hybrid circuit on the printed circuit plate 2 are prevented.

Further, although a flexible insulating layer 13 has been inserted between the radiating plate 1 and the printed circuit plate 2 for further effectively preventing the cracking of the printed circuit plate 2 in the foregoing second embodiment of the hybrid circuit device, it will be understood that the said flexible insulating material layer 13 may be eliminated. And the above embodiments have employed flexible material 11 inserted between the radiating plate 1 and the metal frame 9 to improve airtightness. However, it will be understood that the flexible material 11 can be eliminated from the embodiment shown in FIGS. 5 and 6, since the body of the device 15 is completely sealed by the enclosure resin 6.

What is claimed is:

1. A hybrid circuit device comprising a radiating plate, a printed circuit plate mounted on the radiating plate, a plurality of circuit elements electrically connected on the printed circuit plate to form a hybrid circuit, lead terminals secured to the printed circuit plate for serving as electric terminals of the hybrid circuit, rubber-like insulating material enclosing the periphery of the printed circuit plate, a metal frame having an opening at a position opposed to the printed circuit plate, said metal frame being fixed to the marginal portion of the radiating plate, said rubber-like insulating material being pressed toward the printed circuit plate by the metal frame, flexible insulating material covered on the printed circuit plate, and enclosure resin enclosing at least the flexible insulating material.

2. A hybrid circuit device as defined in claim 1 wherein said lead terminals are extended out of holes provided in the radiating plate.

3. A hybrid circuit device as defined in claim 1 wherein said lead terminals are guided out through the flexible insulating material and the enclosure resin.

4. A hybrid circuit device as defined in claim 1 wherein a flexible insulating layer is inserted between the radiating plate and the printed circuit plate.

5. A hybrid circuit device as defined in claim 1 wherein flexible material is inserted between the radiating plate and the metal frame.

6. A hybrid circuit device as defined in claim 1 further comprising an enclosure resin casing which encloses the hybrid circuit device as defined in claim 1, said casing being filled with enclosure resin in the space between the casing and the circuit device.

7. A hybrid circuit device as defined in claim 6 wherein said radiating plate is bent at the opposite ends thereof to form fixing portions.

* * * * *

UNITED STATES PATENT OFFICE
CERTIFICATE OF CORRECTION

Patent No. 3,689,804 Dated September 5, 1972

Inventor(s) Masaru Ishihama, et al

It is certified that error appears in the above-identified patent and that said Letters Patent are hereby corrected as shown below:

In the heading add:

[30] Foreign Application Priority Data

December 27, 1970 Japan.............136144/70

Signed and sealed this 13th day of March 1973.

(SEAL)
Attest:

EDWARD M.FLETCHER,JR.
Attesting Officer

ROBERT GOTTSCHALK
Commissioner of Patents

USCOMM-DC 60376-P69
* U.S. GOVERNMENT PRINTING OFFICE 1969 O-366-334